United States Patent [19]

Ries et al.

[11] Patent Number: 4,958,214

[45] Date of Patent: Sep. 18, 1990

[54] PROTECTIVE CARRIER FOR SEMICONDUCTOR PACKAGES

[75] Inventors: Richard D. Ries, St. Paul; Dewey W. Smith, Fridley; Spero Payton, Golden Valley, all of Minn.

[73] Assignee: Control Data Corporation, Minneapolis, Minn.

[21] Appl. No.: 184,780

[22] Filed: Apr. 22, 1988

[51] Int. Cl.⁵ .................... H01L 23/54; H01L 23/12
[52] U.S. Cl. ........................... 357/74; 357/68; 357/70
[58] Field of Search ............... 357/74, 68, 80, 70; 174/52.4; 361/413, 414, 415, 394, 399, 395

[56] References Cited

U.S. PATENT DOCUMENTS

| | | | |
|---|---|---|---|
| 4,381,131 | 4/1983 | Demnianiuk | 357/74 |
| 4,672,418 | 6/1987 | Moran et al. | 357/74 |
| 4,692,790 | 9/1987 | Oyamada | 357/74 |
| 4,715,835 | 12/1987 | Matsuoka | 439/893 |
| 4,744,009 | 5/1988 | Grabbe et al. | 361/394 |
| 4,796,080 | 1/1989 | Phy | 357/74 |

FOREIGN PATENT DOCUMENTS 59-114844 7/1984 Japan ..................... 357/74

Primary Examiner—Rolf Hille
Assistant Examiner—S. V. Clark
Attorney, Agent, or Firm—Frederick W. Niebuhr; Robert M. Angus

[57] ABSTRACT

An assembly is disclosed for releasably mounting a semiconductor package with respect to a rigid carrier, in a predetermined alignment with the carrier to protect the package leads and position the leads for electrical testing. Two substantially identical dielectric frames are positioned on opposite sides of the leads and fastened in a sandwich arrangement enclosing remote end portions of the leads. Registration openings, provided at opposed corners of the frames, receive registration pins projected from the carrier, thus to positionally align the package and carrier in transverse directions. Spring-loaded retainers engage a central body of the semiconductor package to retain the package against longitudinal movement relative to the carrier.

12 Claims, 3 Drawing Sheets

PROTECTIVE CARRIER FOR SEMICONDUCTOR PACKAGES

BACKGROUND OF THE INVENTION

This invention relates to semiconductor packages with multiple electrically conductive leads extended from a central body of the package, and more particularly to carriers for accurately mounting such packages for their protection and electrical testing.

Leaded semiconductor packages frequently are mounted in protective carriers. The carriers protect the semiconductor packages against mechanical damage during shipping and handling, and also properly align the semiconductor package, particularly its conductive leads, relative to electrical hardware used in testing the package.

One known technique for accurately aligning the leaded semiconductor package within the protective carrier is to form multiple parallel ribs or rises in the carrier, with each rib or rise disposed between a pair of adjacent parallel leads. With the leads so positioned, the package is accurately aligned with respect to the carrier. For a typical package including a rectangular package body and leads projected outwardly of the body's sides, the ribs secure the package against movement parallel to the major plane of the package, i.e. in mutually perpendicular X and Y directions. A spring loaded beak, latch, snap-on lid or other retainer is used to secure the package in a Z direction orthogonal to the major plane.

Due to the generally poor tolerances associated with the semiconductor package body itself, the semiconductor package body cannot be used to align the package in the X and Y directions. Rather, the ribs or rises of the carrier provide the mechanical means by which the package is aligned in the X and Y directions. A problem with this arrangement, however, is that only these ribs or rises which are in direct contact with the package leads directly prevent the entire semiconductor package from moving significantly in either the X or Y direction. If the carrier and package experience sudden impact during handling or shipping, the ribs or rises prevent the leads from significant movement where as the semiconductor package body, because of its typically poor dimensional tolerances, is not restricted from movement. Consequently this can result in damage or bending of the package leads which will adversely affect the lead true position and subsequent manufacturing operations.

Therefore, it is an object of the present invention to provide a means for aligning a semiconductor package and carrier without providing lead positioning ribs formed on the carrier.

Another object is to provide a means for mounting an integrated circuit package and carrier, in which forces due to any sudden impact are distributed substantially to non-critical locations or features which do not affect the package lead true position or result in damage to the package leads.

Another object is to provide a means for accurately aligning an integrated circuit package relative to a carrier, while electrically isolating the leads from one another to permit electrical testing of the package while mounted on the carrier.

Yet another object is to provide a process for forming a dielectric connection of the leads of an integrated circuit package initially having an electrically conductive lead interconnection, and for later removing the conductive interconnection to electrically isolate the leads.

SUMMARY OF THE INVENTION

To achieve these and other objects, there is provided a carrier assembly for releasably supporting a semiconductor package including a package body and a plurality of leads extended from the body. The carrier assembly includes a rigid carrier and a retaining means mounted movably with respect to the carrier for releasably supporting the package against movement in a longitudinal (Z) direction relative to the carrier. A plurality of electrically conductive leads of the semiconductor package are disposed at least proximate a selected surface of the carrier. The leads have end portions remote from a package body of the semiconductor package. A lead interconnection means is attached to the leads at their end portions to fix the end portions with respect to one another. A first registration means is provided integral with the lead interconnection means, and a second registration means is provided integral with the carrier. These registrations means are positioned to engage one another to secure the interconnection means against transverse movement relative to the carrier, thus cooperating with the retaining means to positionally align the end portions of the leads with respect to the carrier.

In accordance with one feature of the present invention, a non-conductive tie bar is used to interconnect the leads as disclosed in U.S. patent application Ser. No. 076,251, filed July 22, 1987 and assigned to the assignee of this application. Preferably the carrier is constructed of a dielectric material, permitting the leads to engage the selected surface of the carrier when the package is mounted in the carrier. Thus the carrier supports and protects the leads, yet permits electrical testing. Typically, for a substantially flat and rectangular package body comprising a member with leads extended from all sides in a major plane of the package body, the selected surface is planar, and the dielectric lead interconnection means preferably includes a rectangular dielectric frame assembly surrounding the package body.

The registration means can comprise circular openings formed at opposite corners of the dielectric frame, and a pair of pins projected from the carrier, one corresponding to each opening. In a more highly preferred version, the interconnection means includes two dielectric frames, one on each side of the leads, and an adhesive joining the two frames to the semiconductor package leads and/or to each other about the lead end portions. This "sandwich" construction encloses the leads, and also can enclose metal sheet members at opposite corners. The metal sheets provide more durable structure defining the registration openings.

Another aspect of the present invention is a process for manufacturing an assembly comprising a carrier and a leaded semiconductor package releasably mounted to the carrier, including the steps of:

providing a leaded semiconductor package including a package body, a plurality of electrically conductive leads extended outwardly from the package body, and an electrically conductive frame attached to end portions of the leads remote from the package body;

forming a pair of registration openings through the conductive frame at first and second select locations thereon;

forming a pair of alignment openings through a dielectric frame;

fastening the dielectric frame to the leads and in a select position to align each alignment opening with one of the registration openings; and removing portions of the conductive frame other than the select locations, whereby the select locations are integrally mounted with respect to the lead end portions by the dielectric frame and are electrically isolated from the leads.

The use of this process permits highly accurate positioning of the registration openings relative to the leads, due to the initial fixed relationship between the leads and conductive frame. The dielectric frame is attached to the lead end portions with the conductive frame still intact, preserving the positional relationship between the leads and registration openings. Later, when portions of the conductive frame are removed to electrically isolate the leads, the dielectric frame maintains the desired relationship between the registration openings and leads.

The carrier assembly constructed in accordance with the present invention thus positively aligns the semiconductor package and carrier, which allows alignment of the package for testing and the like simply by aligning the carrier. In contrast to the present approach utilizing ribs, the force of any sudden impact or jostling is absorbed by the metal sheets in the opposite corners of the package assembly, the adhesive between the sheets and dielectric frames, and the frames themselves—rather than directly by the leads. This eliminates the interaction of any particular lead with the carrier, thus removing the potential for lead damage. The presence of the metal sheets possessing the registration openings ensures a more precise, reliable and repeatable positioning of the package and carrier. Finally, when circular openings and pins are used for registration, and the openings are positioned at opposed corners of a rectangular dielectric frame or pair of frames, minimal force is required to resist rotation of the package relative to the carrier, further enhancing the security of the connection.

IN THE DRAWINGS

For a better understanding of the above and other features and advantages, reference is made to the following detailed description of the invention and the drawings, in which.

DETAILED DESCRIPTION OF THE PREFERRED EMBODIMENT

Figure 1:
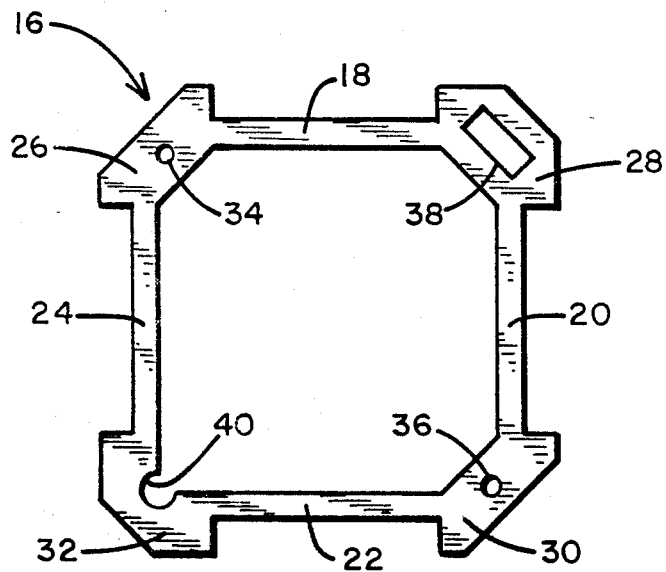
FIG. 1 is a top plan view of a dielectric frame adapted for use as a lead interconnection in accordance with the present invention.
Figure 2:
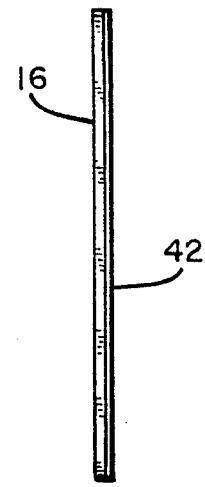
FIG. 2 is an end view of the frame of FIG. 1.

Turning now to the drawings, there is shown in FIG. 1 a dielectric lead interconnecting frame 16 suited for releasable mounting of a semiconductor package in accordance with the present invention. Frame 16 preferably is constructed of a glass-fiber filled epoxy resin, polyimide or other suitable material to form a substantially rigid, although not brittle, non-conductive frame. The frame 16 is essentially rectangular, including four bars 18, 20, 22 and 24 disposed for connection to the leads of a semiconductor package, and enlarged corners at 26, 28, 30 and 32. Alignment apertures are formed at 34 and 36 in diagonally opposite corners 26 and 30, respectively. A rectangular opening 38 is formed in corner 28, and cut-out 40 is formed in the opposite corner 32. Dielectric frame 16 is coated on one surface with an adhesive 42, preferably a high temperature acrylic adhesive.

Figure 3:
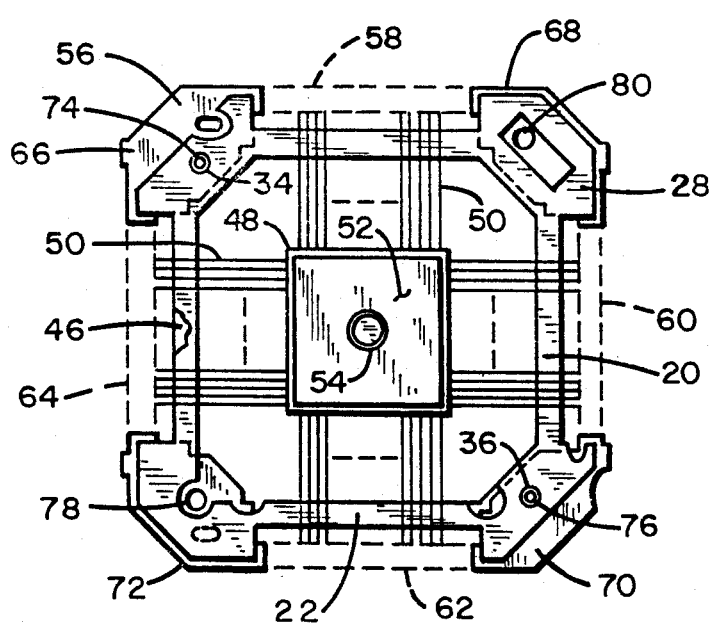
FIG. 3 is a top plan view of a leaded semiconductor package in which end portions of the leads are connected to the dielectric frame.
Figure 4:
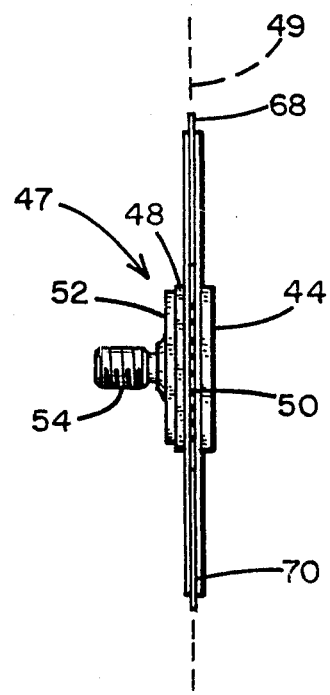
FIG. 4 is an end view of the package of FIG. 3.

FIGS. 3 and 4 illustrate a semiconductor package 47 mounted to a non-conductive frame assembly including frame 16 and a second dielectric frame 46 substantially identical to frame 16 and behind frame 16 in alignment with it as viewed in FIG. 3. The semiconductor package includes a centrally located package body consisting of an alumina base 48 and an alumina cap 44, generally flat and rectangular, with a major plane represented by a broken line at 49. Base 48 and cap 44 are joined together to enclose an integrated circuit chip. A plurality of fine, electrically conductive leads 50 are extended outwardly from all four sides of the package body and along the major plane. A stud 54 is extended outwardly of the package body normal to the major plane and is attached to a heat spreader 52, which in turn is attached to base 48.

Prior to their interconnection with dielectric frames 16 and 46, leads 50 are supported, particularly at their ends remote from the package body, by a conductive frame 56. Frame 56 initially includes conductive tie bars positioned as indicated by broken lines at 58, 60, 62 and 64, and enlarged conductive corner regions 66, 68, 70 and 72. Typically the conductive frame is formed of the same conductive material comprising the leads, e.g., a nickel and gold plated metal alloy, with the leads and frame (including corner regions) formed as a single etching, stamping or the like. Two registration openings at 74 and 76 are formed through corner regions 66 and 70, respectively. An opening 78 is formed through corner region 72, with an offset opening 80 formed in corner region 68. Each of openings 74–80 is selectively and precisely positioned with respect to leads 50, as these openings are formed in the original etching or stamping.

In accordance with the present invention, the assembly of dielectric frames 16 and 46 are fastened to the lead remote end portions in lieu of the conductive frame, while retaining the selected and precise positioning of the conductive corner regions 66–72 with respect to the leads. In particular, with conductive tie bars 58–64 still forming part of conductive frame 56 and connected to the lead remote end portions, dielectric frames 16 and 46, coated with adhesive 42, are positioned on opposite sides of the conductive frame, and selectively aligned with the conductive frame such that the openings through each dielectric frame, and the corresponding openings of frame 56, are aligned as shown in FIG. 3. Then, with the adhesive and lead end portions between them, frames 16 and 46 are forced against the leads and one another under pressure. If desired, adhesive 42 could also be heat sensitive or ultraviolet light sensitive in which case pressure, heat, ultraviolet light or any combination thereof could be used to cure or set the adhesive As a result, leads 50, particularly at their remote end portions, are integrally secured with respect to a dielectric frame assembly including frames 16 and 46.

At this point, conductive tie bars 58–64 are cut away from frame 56, leaving the corner regions as illustrated in FIG. 3. Preferably, the conductive tie bars and their associated dielectric tie bars are spaced apart from one another, so that removal of each conductive bar leaves remote ends of the leads exposed outwardly of the dielectric frame assembly.

With the conductive tie bars removed, dielectric tie bars 18–24 effectively take the place of the conductive bars in securing the remote lead ends integrally with respect to one another, thus to preserve a desired spacing between adjacent leads. Moreover, dielectric frames 16 and 46 are integrally secured to corner regions 66–72 by virtue of the adhesive, thus to preserve the desired alignment of the leads with the openings formed through the conductive frame, particularly registration openings 74 and 76. As indicated in FIG. 3, alignment apertures 34 and 36 are slightly larger than their associated registration openings. This reduces the need for absolute accuracy in aligning frames 16 and 46 with the conductive frame, and insures that the positioning of semiconductor package 47 with respect to a carrier depends upon the registration openings rather than the alignment apertures.

Figure 5:
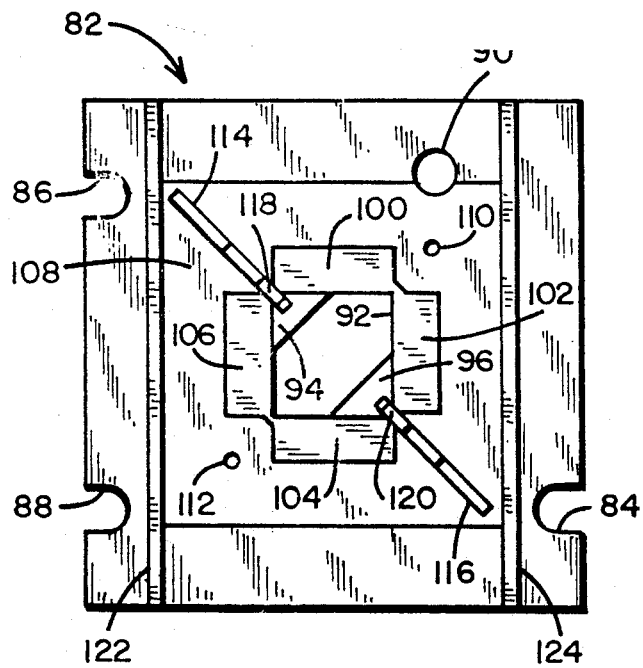
FIG. 5 is a top plan view of a carrier adapted for releasably supporting the semiconductor package and dielectric frame.
Figure 6:
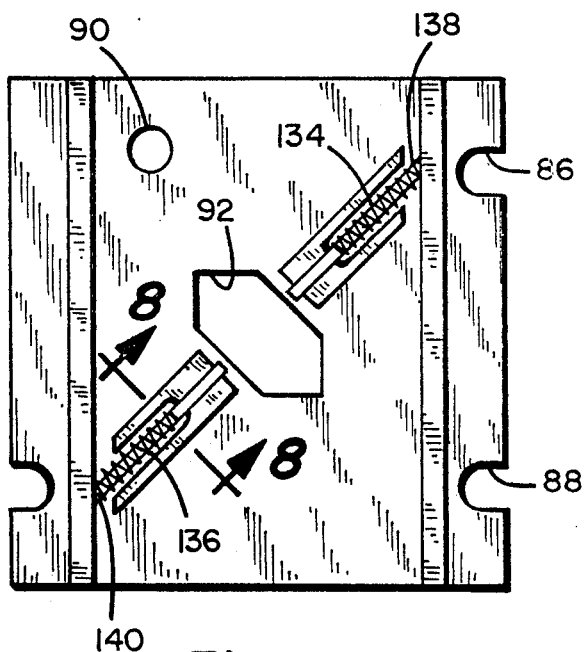
FIG. 6 is a bottom plan view of the carrier.
Figure 7:
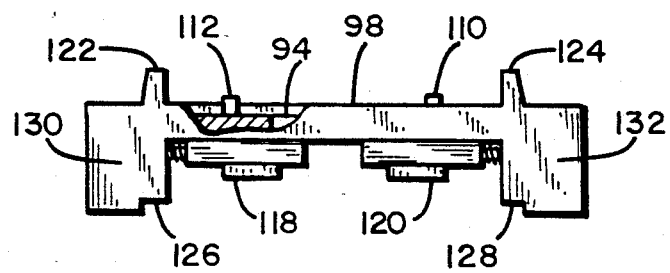
FIG. 7 is an end elevation of the carrier.

FIGS. 5–7 illustrate a carrier 82 particularly well suited for transporting and handling semiconductor package 47, and for positioning the package for electrical testing. Carrier 82 preferably is constructed of a substantially rigid (e.g. glass filled), dielectric material, for example, plastics such as polyethersulfone (PES), polyphenylene sulfide, nylon, polyetherimide (PEI), polyamide-imide, polycarbonate and polyester. The preferred carrier material should withstand wide range temperature cycling, e.g. over a range of $-55°$ to $125°$ C. The carrier sheet resistivity is typically $10^{10}$–$10^{13}$ ohms/square, although the actual optimum value depends upon the nature of the integrated circuit chip. Alternatively, if a dielectric frame is disposed between the leads and carrier or if no electrical testing is contemplated, the carrier can be constructed of aluminum or other metals. Carrier 82 is rectangular, and includes a plurality of alignment grooves 84, 86 and 88, which cooperate with a carrier alignment hole 90 to positionally align carrier 82, and thus align semiconductor package 47 when mounted in the carrier, with respect to an electrical testing socket (not shown).

A central opening 92 is formed through carrier 82 and is sufficiently large to accommodate the semiconductor package body. A pair of triangular shelves 94 and 96, formed at opposite corners of opening 92, provide a horizontal stop to prevent excessive downward deflection of the semiconductor package during handling, shipping or testing. These triangular shelves are parallel to and recessed below a top surface 98 of the carrier.

Immediately surrounding opening 92 are four raised portions 100, 102, 104 and 106, which together provide a raised surface substantially in the plane of upper surface 98. When semiconductor package 47 is mounted in carrier 82, the package leads 50 rest upon the raised surface 98. A recess or trough 108 is formed outwardly of and surrounding the raised portions in order to accommodate the lower dielectric frame 46.

A pair of cylindrical registration pins, indicated at 110 and 112, extend vertically upward from recess 108. Pins 110 and 112 have a uniform circular horizontal profile, with a diameter just slightly less than the diameter of registration openings 74 and 76.

A pair of diagonally disposed channels 114 and 116 are formed through carrier 82 and extend away from opening 92 along recess 108. Channel 114 supports a retainer 118 for diagonal sliding movement toward and away from the central opening, and channel 116 similarly supports an opposite retainer 120. A pair of parallel ribs 122 and 124 are provided near opposite sides of carrier 82, and project upwardly from top surface 98. Directly below the ribs and aligned with them are opposed cut-outs 126 and 128, each formed in the bottom of one of legs 130 and 132 of the carrier. The alignment of the ribs and cut-outs affords a convenient, stable stacking of multiple carriers.

From FIG. 6 it is seen that retainers 118 and 120 extend beneath channels 114 and 116, respectively. Each retainer is biased toward opening 92 by a coil spring, specifically a coil spring 134 in connection with retainer 118 and a spring 136 in connection with retainer 120. A pair of rods 138 and 140 are disposed diagonally, each surrounded by the outer portion of its associated coil spring.

Figure 8:
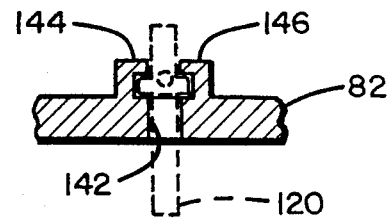
FIG. 8 is a sectional view taken along the line 8—8 in FIG. 6.
Figure 9:
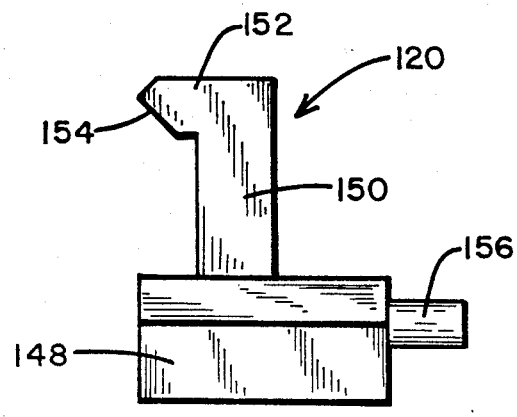
FIG. 9 is an enlarged elevation of a retainer of the carrier.
Figure 10:
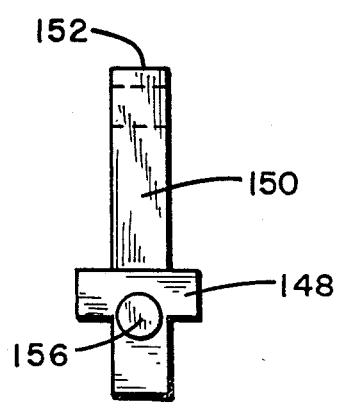
FIG. 10 is an end elevation of the retainer.

FIGS. 8–10 illustrate retainer 120 in greater detail, along with its mounting within channel 116. It is to be understood that retainer 118 is substantially similar, as is the nature of its mounting within channel 114. Considering first FIG. 8, channel 116 includes an elongate slot 142 formed through the carrier recess, and a widened portion defined by a pair of opposed, L-shaped legs 144 and 146 which extend downwardly from the carrier, but appear to extend upwardly in FIG. 8 as this figure is inverted. Retainer 120, as shown in broken lines, extends outwardly from the channel in both vertical directions.

As seen in FIGS. 9 and 10, retainer 120 includes a T-shaped body 148, a leg 150 extended vertically upward from the body, and a beak or head 152 including an inclined surface 154 adapted for contact with heat spreader 52 when semiconductor package 47 is mounted in the carrier. A rod 156 extends horizontally from body 148, and is surrounded by the inner portion of coil spring 136, thereby cooperating with rod 140 to retain the spring. A portion of the wall surrounding central opening 92 limits the travel of each retainer responsive to its associated coil spring.

Figure 11:
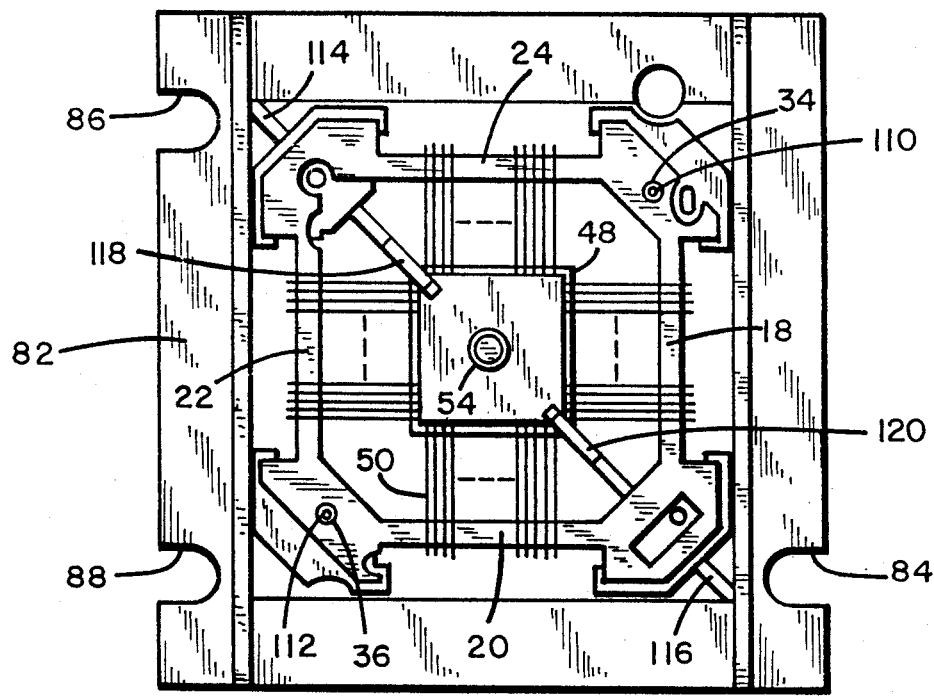
FIG. 11 is a top plan view of the semiconductor and frame mounted on the carrier.

The mounting of semiconductor package 47 to carrier 82 is illustrated in FIG. 11. The mounting is conveniently accomplished automatically or by hand, by moving retainers 11 and 120 diagonally away from opening 92 to admit package body 48 into the opening, while selectively positioning corner regions 66 and 70 so that their respective registration openings 74 and 76 receive pins 110 and 112. The close fit of the registration pins within the registration openings substantially prevents any movement of the dielectric frame assembly in any horizontal or transverse (X,Y) direction with respect to carrier 82. The remote end portions of the leads, being integrally attached to the tie bars of dielectric frames 16 and 46, are likewise secured against such movement. The lead ends thus are positionally aligned with carrier 82, and therefore also can be positionally aligned with any electrical testing equipment by aligning the carrier with such equipment. While a single registration opening and pin of non-circular profile might be marginally adequate for determining the XY alignment, the opposed pair as disclosed is preferable. Similarly, three or more registration pins and openings can be employed.

Retainers 118 and 120, urged toward one another by coil springs 134 and 136, engage the package body, along their inclined surfaces 154, to urge semiconductor package 47 downwardly to position leads 50 against raised portions 100–106, to firmly secure the semiconductor package in the vertical or longitudinal (Z) direction as well. Between the dielectric frames and the package body, raised portions 100–106 are thus contiguous with leads 50 to protect them from damage, and support and position them in the Z direction for electrical testing.

A feature of the present invention is that leads 50 act in concert to support the dielectric frame assembly and semiconductor package body substantially integrally relative to one another. The shock from any sudden impact upon carrier 82 is transferred to the frame assembly from the registration pins to their associated corner regions, remote from the leads and package body. The shock then travels along the remainder of the frame assembly, where it is substantially absorbed before reaching the leads and the semiconductor package body. This arrangement insures that no individual lead is isolated to bear a disproportionate share of the shock, which more effectively protects leads against damage as compared to the aforementioned conventional ribs. Moreover, in replacing such ribs with the essentially flat and horizontal raised surface provided by the raised portions, a carrier constructed in accordance with the present invention can releasably and interchangeably support semiconductor packages having different numbers of leads, different spacings between adjacent leads, and different lead orientations.

What is claimed is:

1. A carrier assembly for releasably supporting a semiconductor package including a package body and a plurality of leads extended from the body, said carrier assembly including:
   a rigid carrier, and a retaining means mounted movably with respect to said carrier for releasably securing a semiconductor package against movement in a longitudinal direction relative to the carrier, with a plurality of electrically conductive leads of said semiconductor package disposed at least proximate a selected surface of said carrier, said leads having end portions remote from a package body of said semiconductor package;
   a lead interconnection means, attached to said leads at the end portions thereof, for substantially fixing said end portions with respect to one another; and
   a first registration means integral with said lead interconnection means, and a second registration means integral with said carrier, said first and second, registration means positioned to engage one another to releasably secure said interconnection means against transverse movement relative to said carrier and thereby cooperate with said retaining means to positionally align said end portions of said leads with respect to said carrier.

2. The assembly of claim 1 wherein:
said carrier and said interconnection means are constructed substantially of dielectric materials, and said selected surface of said carrier is positioned to contiguously engage said leads and thereby cooperate with said retaining means to so secure said semiconductor package.

3. The assembly of claim 2 wherein:
said selected surface is substantially planar, and said leads extend from said package body in a plane parallel to the plane of said selected surface.

4. The assembly of claim 1 wherein:
said first registration means comprises a registration opening formed through said lead interconnection means, and said second registration means comprises a pin integral with said carrier and extended therefrom in said longitudinal direction, said pin having a substantially uniform transverse profile corresponding to the shape of said registration opening, said pin when extended through said registration opening tending to positionally align said semiconductor package and said carrier.

5. The assembly of claim 3 wherein:
said first registration means comprises a plurality of registration openings formed through said lead interconnection means, and said second registration means comprises a plurality of pins integral with said carrier and extended from the carrier in said longitudinal direction, each of said pins associated with one of said registration openings and having a substantially uniform transverse profile corresponding to the shape of its associated registration opening, said pins when extended through their associated registration openings tending to positionally align said semiconductor package with respect to said carrier.

6. The assembly of claim 1 wherein:
said leads substantially surround said semiconductor package, and said lead interconnection means includes a first dielectric frame surrounding said package and attached proximate the end portions of said leads.

7. The assembly of claim 6 wherein:
said lead interconnection means further includes a second dielectric frame corresponding in size and shape to said first dielectric frame, and an adhesive means for securing said dielectric frames fixedly with respect to said leads on opposite sides of said leads.

8. The assembly of claim 7 wherein:
said first and second frames are rectangular, said first registration means comprises two registration openings formed through said frames at opposite corners thereof, and said second registration means comprises two pins integral with said carrier and extended from the carrier in said longitudinal direction, each of said pins associated with one of the registration openings and having a transverse profile corresponding to the shape of its associated registration opening, said pins when extended through their associated registration openings tending to positionally align said dielectric frames with respect to the carrier.

9. The assembly of claim 8 wherein:
said registration openings are circular and substantially the same size.

10. The assembly of claim 9 further including:
metallic sheet members integrally mounted between said dielectric frames at said opposite corners and electrically isolated from said leads, said registration openings being formed through said sheet members.

11. The carrier assembly of claim 1 wherein:

said retaining means includes means forming first and second channels in said carrier, and first and second retaining members, each mounted in its respective one of said channels for linear movement toward and away from a central region of said carrier, and a biasing means for urging said first and second retaining members toward said central region, said retaining members engaging said package body when said body is positioned at said central region to positively retain the package body in a longitudinal direction relative to the carrier.

12. The assembly of claim 11 wherein:

each of said retaining members includes a retainer body contained in its associated channel for sliding movement within said channel, a leg extended from the retainer body, and a beak extended from one end of the leg, said beak including an inclined surface positioned to engage said package body to so retain said package body in a longitudinal direction relative to the carrier.

* * * * *